United States Patent [19]
Kodera et al.

[11] Patent Number: 5,489,336
[45] Date of Patent: Feb. 6, 1996

[54] APPARATUS FOR FORMING A SILICON OXIDE FILM ON A SILICON WAFER

[75] Inventors: Masako Kodera, Matsudo; Masami Watase, Tokyo; Shiro Mishima; Katsuya Okumura, both of Yokohama, all of Japan

[73] Assignee: Kabushiki Kaisha Toshiba, Kawasaki, Japan

[21] Appl. No.: 329,651

[22] Filed: Oct. 25, 1994

Related U.S. Application Data

[62] Division of Ser. No. 928,070, Aug. 11, 1992, Pat. No. 5,395,645.

[30] Foreign Application Priority Data

Aug. 12, 1991 [JP] Japan ................................. 3-225380

[51] Int. Cl.⁶ ............................................ B05C 3/00
[52] U.S. Cl. .......................... 118/400; 118/404; 118/407; 118/429
[58] Field of Search ............................ 118/400, 404, 118/407, 429; 427/126.2

[56] References Cited

U.S. PATENT DOCUMENTS

| | | | |
|---|---|---|---|
| 2,725,032 | 11/1955 | Mann | 118/404 X |
| 4,563,976 | 1/1986 | Foell et al. | 118/401 |
| 4,931,109 | 6/1990 | Sabatka | 148/249 |

*Primary Examiner*—William Powell
*Attorney, Agent, or Firm*—Finnegan, Henderson, Farabow, Garrett & Dunner

[57] ABSTRACT

Disclosed is a method of forming a silicon oxide film on a silicon wafer, comprises the steps of keeping a supersaturated hydrofluoric acid solution of silicon oxide on the surface of a silicon wafer in a thickness of not more than 20 mm, the solution having a predetermined temperature, heating the supersaturated solution until the solution reaches a thermal equilibrium, and maintaining for a predetermined period of time the temperature at which a thermal equilibrium is established in the supersaturated solution so as to form a silicon oxide film on the surface of the silicon wafer.

20 Claims, 10 Drawing Sheets

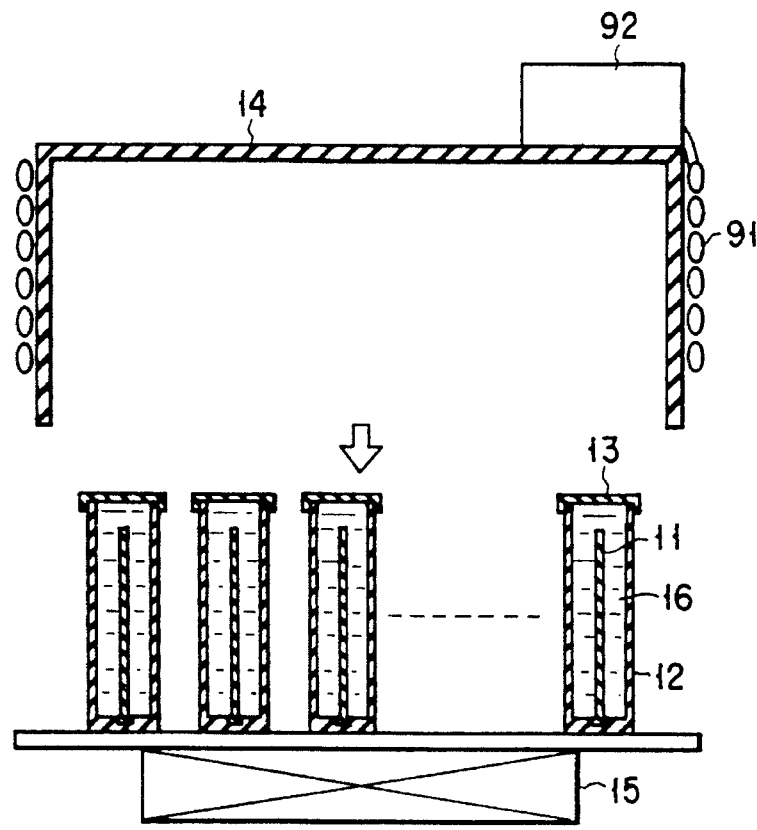
F I G. 1A
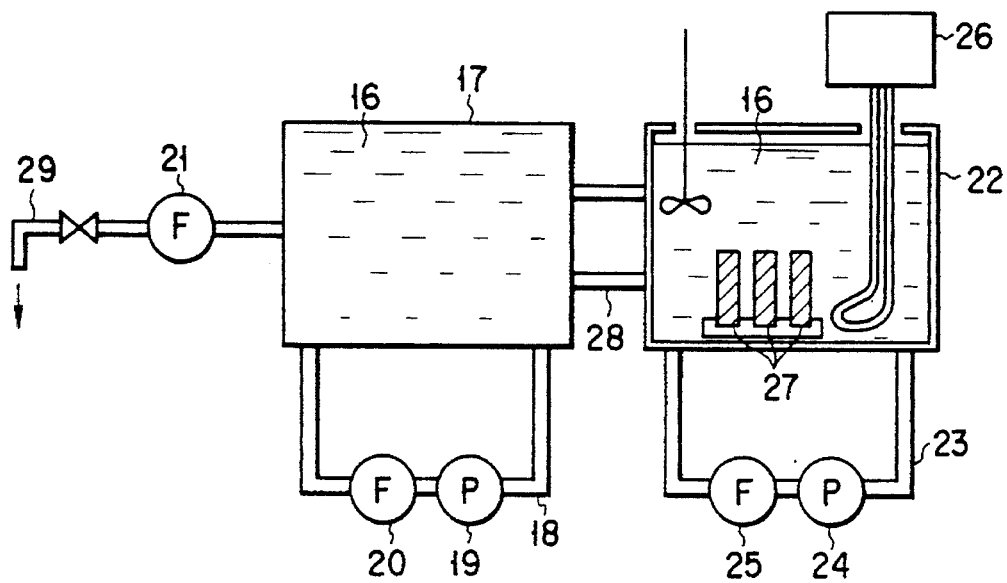
F I G. 2

F I G. 3
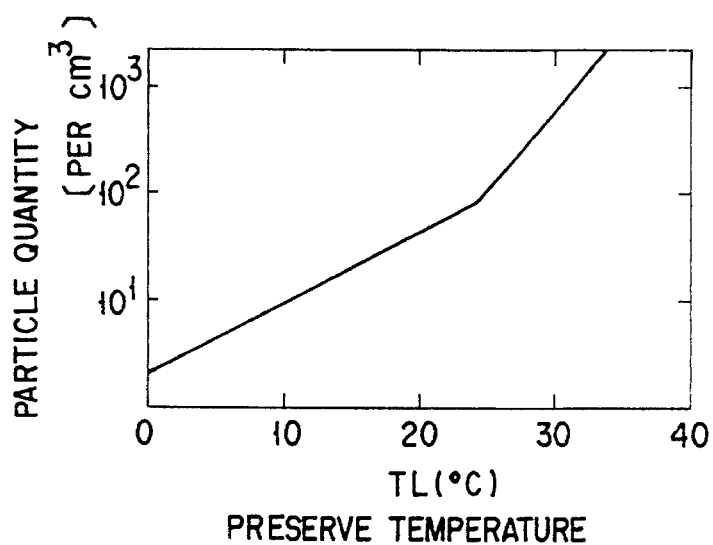
F I G. 4
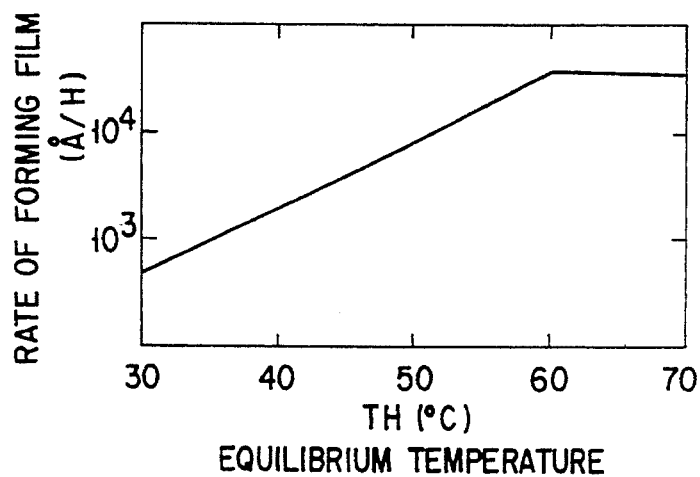
F I G. 5
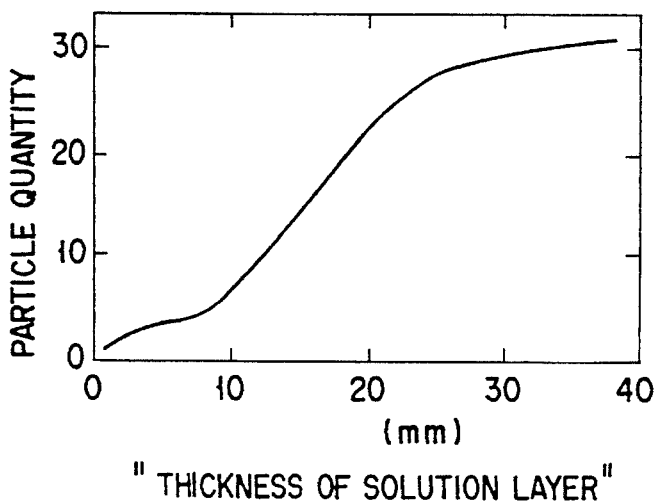
"THICKNESS OF SOLUTION LAYER"

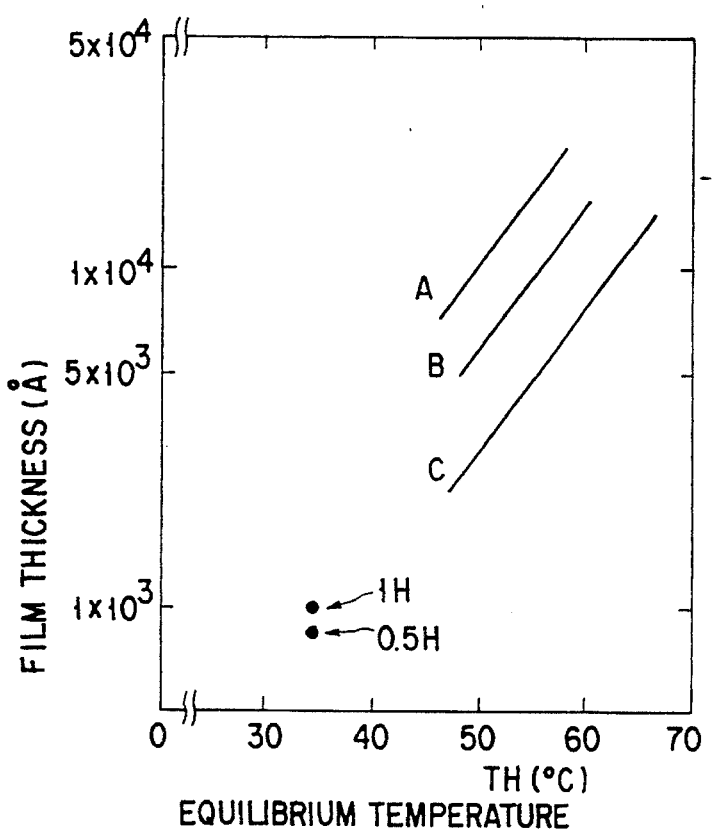
F I G. 6
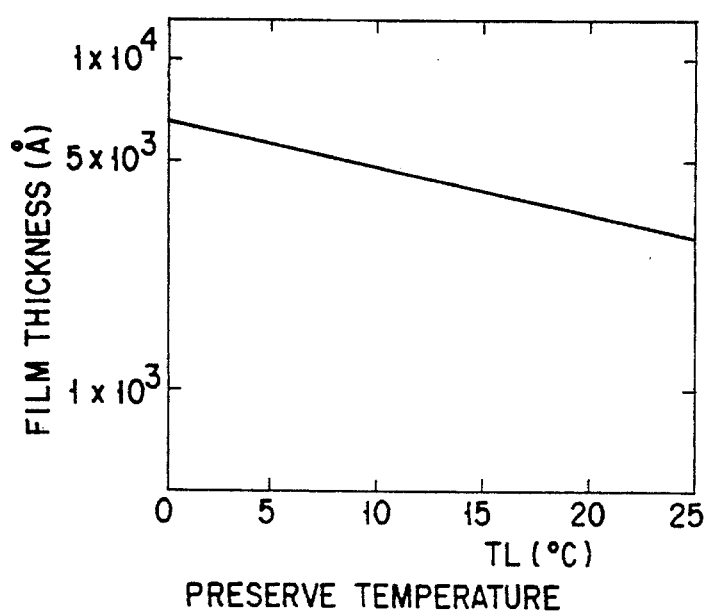
F I G. 7

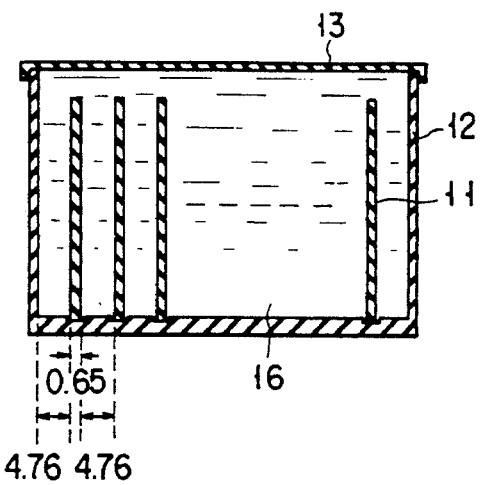
F I G. 10A
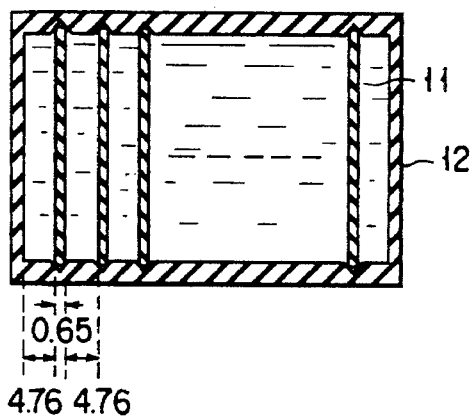
F I G. 10B
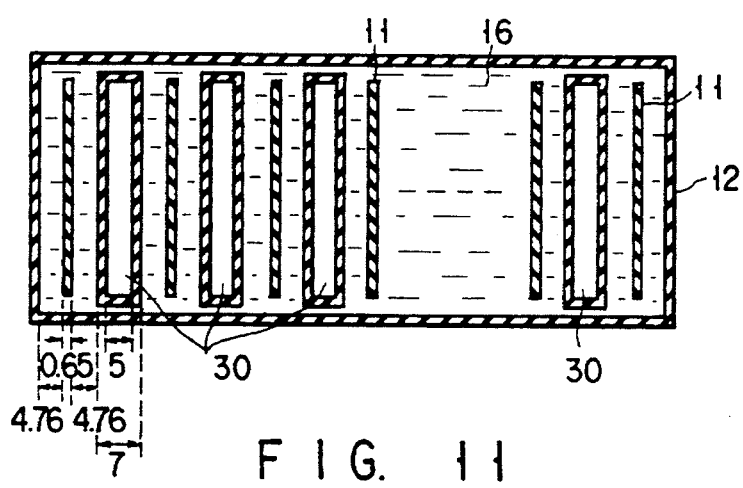
F I G. 11

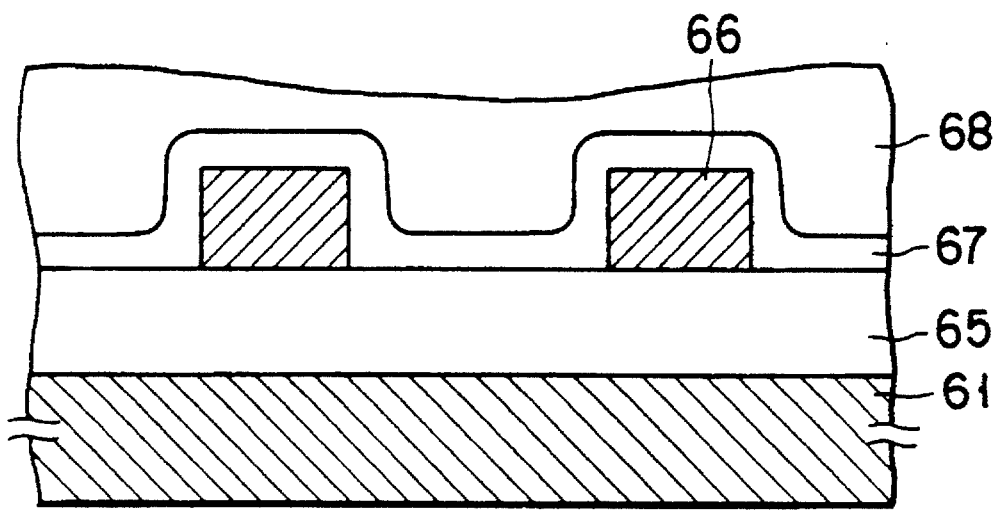
F I G. 14
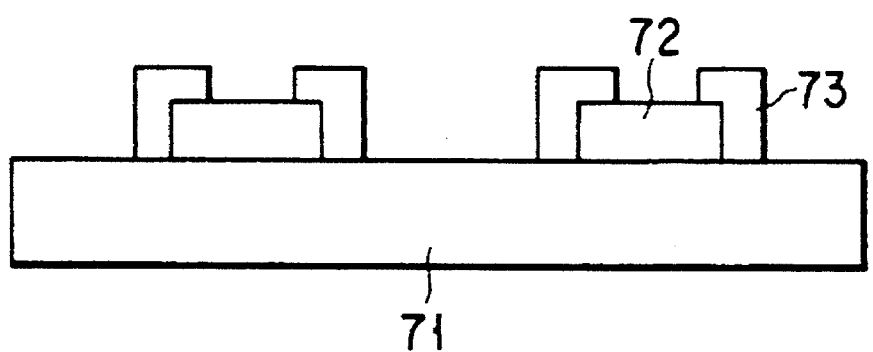
F I G. 15

APPARATUS FOR FORMING A SILICON OXIDE FILM ON A SILICON WAFER

This is a division of application Ser. No. 07/928,070, filed Aug. 11, 1992, now U.S. Pat. No. 5,395,645.

BACKGROUND OF THE INVENTION

1. Field of the Invention

The present invention relates to formation of a silicon oxide film used as an insulation film in a semiconductor device or a liquid crystal device, particularly, to a method and apparatus for depositing a silicon oxide film from a supersaturated hydrofluoric acid solution of silicon oxide at low temperatures.

2. Description of the Related Art

A silicon oxide ($SiO_2$) film, which is excellent in its mechanical strength and insulating properties, is used in various fields. Particularly, a silicon oxide film is used in a semiconductor device as an interlayer insulating film, a capacitor oxide film, an impurity diffusion source, a gate oxide film, a protective film, etc. Also, where an alkali-containing glass such as a soda-lime glass or a borosilicate glass is used as a substrate glass in a liquid crystal display panel or a solar cell, the glass surface is covered with a silicon oxide film for preventing elution of the alkali component. Further, a silicon oxide film is used as a protective film for a plastic substrate surface of an optical disk.

Known methods for forming a silicon oxide film include, for example, vacuum vapor deposition, sputtering, CVD and thermal oxidation of silicon. Recently, a method utilizing precipitation from a supersaturated hydrofluoric acid solution of silicon oxide is employed for forming a silicon oxide film, as disclosed in, for example, Published Examined Japanese Patent Application No. 1-27574 and Japanese Patent Application No. 2-418924. The silicon oxide film formed by the precipitation method exhibits a high covering property and a high insulation breakdown voltage. Also, the silicon oxide film can be formed at low temperatures. It follows that the precipitation method is useful when employed for the manufacture of, particularly, a semiconductor device. The silicon oxide film formed by the precipitation method is generally called an SORD (Silicon Oxide Room Temperature Deposition) film, a SORD $SiO_2$ film, or an LPD (Liquid Phase Deposition) film.

The precipitation method for forming a silicon oxide film on a substrate is particularly useful in the manufacture of a semiconductor device. In forming a silicon oxide film by the precipitation method, a saturated solution of silicon oxide is prepared by adding silicon oxide (silica) to hydrofluoric acid until the solution is saturated. In this case, silicon oxide reacts with hydrofluoric acid (HF) to form a saturated state as given below:

$$H_2SiF_6 + 2H_2O \rightleftharpoons SiO_2 + 6HF \qquad (1)$$

Then, aluminum is added to the saturated hydrofluoric acid solution of silicon oxide. As a result, aluminum reacts with hydrofluoric acid to form aluminum fluoride and hydrogen. If hydrofluoric acid is consumed by its reaction with aluminum, silicon oxide becomes excessive in the solution so as to form a supersaturated hydrofluoric acid solution of silicon oxide. Silicon oxide in the supersaturated solution is deposited on the surface of a substrate such as a semiconductor wafer dipped in the solution.

In the precipitation method outlined above, it is possible to use, for example, iron or boric acid in place of aluminum for promoting the silicon oxide precipitation. Also, the silicon oxide solubility in hydrofluoric acid is increased with temperature drop. Thus, if a solution saturated with silicon oxide at low temperatures is left to stand at high temperatures, the solution becomes supersaturated, leading to precipitation of silicon oxide.

FIG. 17 shows an apparatus for forming a silicon oxide film by the conventional precipitation method described above. As shown in the drawing, a film-forming vessel 1 is filled with a supersaturated hydrofluoric acid solution of silicon oxide 3. The supersaturated solution 3 overflowing from the vessel 1 is received by an over-flow vessel 2 disposed in communication with the vessel 1 and, then, flows through a pipe 4 connected to the bottom of the over-flow vessel 2 back into the film-forming vessel 1. It is seen that the supersaturated solution 3 flowing through the pipe 4 passes through a pump 5 and a filter 6, with the result that the larger precipitated particles and dust entering the solution during the reaction or the circulation are removed from the supersaturated solution 3.

An aluminum plate 7 is dipped in the solution 3 so as to make the solution 3 within the film-forming vessel 1 supersaturated with silicon oxide. Specifically, aluminum within the over-flow vessel 2 is dissolved in the solution and reacts with hydrofluoric acid, as described previously, with the result that the equilibrium of the film-forming solution denoted by formula (1) is collapsed so as to permit precipitation of silicon oxide on the surface of, for example, a semiconductor wafer 8 dipped in the film-forming solution 3.

The precipitation method described above does not necessitate a vacuum apparatus and a high temperature reaction apparatus and, thus, is superior to CVD method in the cost of an apparatus forming a silicon oxide film. Also, even if the substrate has a stepped portion, the substrate can be covered with a silicon oxide film of a uniform thickness. In other words, the silicon oxide film formed by the precipitation method is superior to that formed by CVD in the step coverage property.

In the conventional precipitation method, however, the film-forming rate is as low as about 1000 Å/H (hour). In other words, it takes as much as 10 hours to form a silicon oxide film having a thickness of, for example, 1 µm. It should also be noted that precipitation takes place everywhere within the film-forming solution 3, with the result that as small as only about 1% of silicon oxide precipitated from the solution is deposited on the substrate 8. The major portion of the precipitated silicon oxide is caught by the filter 6, deposited on the inner surface of the film-forming vessel, or discarded in the step of washing the filter. It follows that the utilization rate of the raw material silicon oxide is very low in the conventional precipitation method. What should also be noted is that the silicon oxide deposited on the inner surface of the film-forming vessel is peeled to form a lump, which is attached as dust to the substrate 8. Naturally, bad effects are given by the attached dust in the subsequent steps of manufacturing a semiconductor device.

It is certainly possible to improve the film-forming rate in the conventional precipitation method by elevating the temperature of the film-forming solution 3 which is kept in general at 35° C. or by increasing the amount of the aluminum plate 7 so as to increase the silicon oxide precipitation rate. In this case, however, the amount of the precipitated silicon oxide particles caught by the filter 6 is also increased, with the result that the filter 6 is plugged in a short time and, thus, the silicon oxide film formation on the substrate 8 is impaired. The highest film-forming rate achieved by the conventional precipitation method, in which the precipitation reaction is promoted without impairing the oxide film formation, is as low as only about 1400 A/H. Even in this case, the utilization rate of the precipitated silicon oxide particles remains very low. In addition, a silicon oxide film is likely to be formed easily on the inner surface of the film-forming vessel in accordance with increase in the film-forming rate. The silicon oxide film thus formed tends to peel off and to be attached to the substrate 8, with the result that the subsequent steps for forming fine patterns are seriously impaired.

Further, it may be possible to enlarge the film-forming vessel 1 so as to permit a simultaneous processing of a large number of substrates. This measure certainly permits increasing the through-put of the film-forming apparatus. However, where a very large number of steps are involved in the manufacturing process of the desired article as in the manufacture of an LSI, it is desirable to diminish the processing time for each step as much as possible in order to shorten the time required for the manufacture of the desired article.

SUMMARY OF THE INVENTION

An object of the present invention is to provide a method and apparatus for forming a silicon oxide film, which permits increasing the film-forming rate and utilization rate of the raw material, and suppressing the dust generation from the apparatus.

According to the present invention, there is provided a method of forming a silicon oxide film on a silicon wafer, comprising the steps of keeping a supersaturated hydrofluoric acid solution of silicon oxide on the surface of a silicon wafer in a thickness of not more than 20 mm, said solution having a predetermined temperature; heating the supersaturated solution until the solution reaches a thermal equilibrium; and maintaining for a predetermined period of time the temperature at which a thermal equilibrium is established in the supersaturated solution so as to form a silicon oxide film on the surface of the silicon wafer.

The present invention also provides an apparatus for forming a silicon oxide film on a silicon wafer, comprising:
a vessel housing a silicon wafer and a supersaturated hydrofluoric acid solution of silicon oxide, said supersaturated solution having a predetermined temperature;
means for keeping the supersaturated solution on the surface of the silicon wafer in-a thickness of not more than 20 mm; and
means for heating the supersaturated solution until the solution reaches a thermal equilibrium.

In the method of the present invention, a supersaturated hydrofluoric acid solution of silicon oxide is kept on the substrate surface in a thickness of not more than only 20 mm. The particular technique permits markedly decreasing the amount of the solution used for forming an oxide film, e.g., decrease to about ¹/₁₄ for the conventional technique. Also, the temperature of the solution can be controlled very easily. Since the temperature can be controlled at a level most adapted for the film formation, the forming rate of the silicon oxide film can be increased. The particular technique also permits increasing the utilization rate of the raw material silicon oxide. Further, since in this embodiment the one time used solution is cast away, the dust generation from the film-forming apparatus can be suppressed.

The film-forming apparatus of the present invention comprises a means for keeping the thickness of a supersaturated hydrofluoric acid solution of silicon oxide at a predetermined level. The means has a thickness of not more than about 4 cm, houses a silicon wafer, and is filled with a supersaturated hydrofluoric acid solution of silicon oxide.

The particular construction permits markedly decreasing the amount of the supersaturated solution required for forming a_silicon oxide film on a single wafer, compared with the conventional technique. Also, the temperature of the supersaturated solution can be controlled as desired by heating means, making it possible to markedly improve the film-forming rate, compared with the conventional technique. Further, the utilization rate of the raw material silicon oxide can be increased in the apparatus of the present invention. Further, the dust generation from the apparatus can be suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a cross sectional view showing the film-forming part of an apparatus for forming a silicon oxide film according to one embodiment of the present invention;

FIG. 2 is a cross sectional view showing the control section of a silicon oxide film-forming apparatus of the present invention;

FIG. 3 is a graph showing the relationship between the number of particles having a diameter of not less than 1 μm and the preserve temperature;

FIG. 4 is a graph showing the relationship between the film-forming rate and the equilibrium temperature $T_H$;

FIG. 5 is a graph showing the relationship between the number of particles having a diameter of not less than 1 μm and the thickness of the film-forming solution layer;

FIG. 6 is a graph showing the relationship between the thickness of the formed film and the equilibrium temperature $T_H$;

FIG. 7 is a graph showing the relationship between the thickness of the formed film and the preserve temperature $T_L$;

FIGS. 9A, 9B, 10A, 10B, 11, 12A, 12B, 12C and 13 are cross sectional views and plan views each showing a silicon wafer and tool used in the present invention;

FIG. 14 is a cross sectional view showing a semiconductor device manufactured by employing the technical idea of the present invention;

FIG. 15 is a cross sectional view showing a photo mask used in the method of the present invention;

DETAILED DESCRIPTION OF THE PREFERRED EMBODIMENTS

Figure 1B:
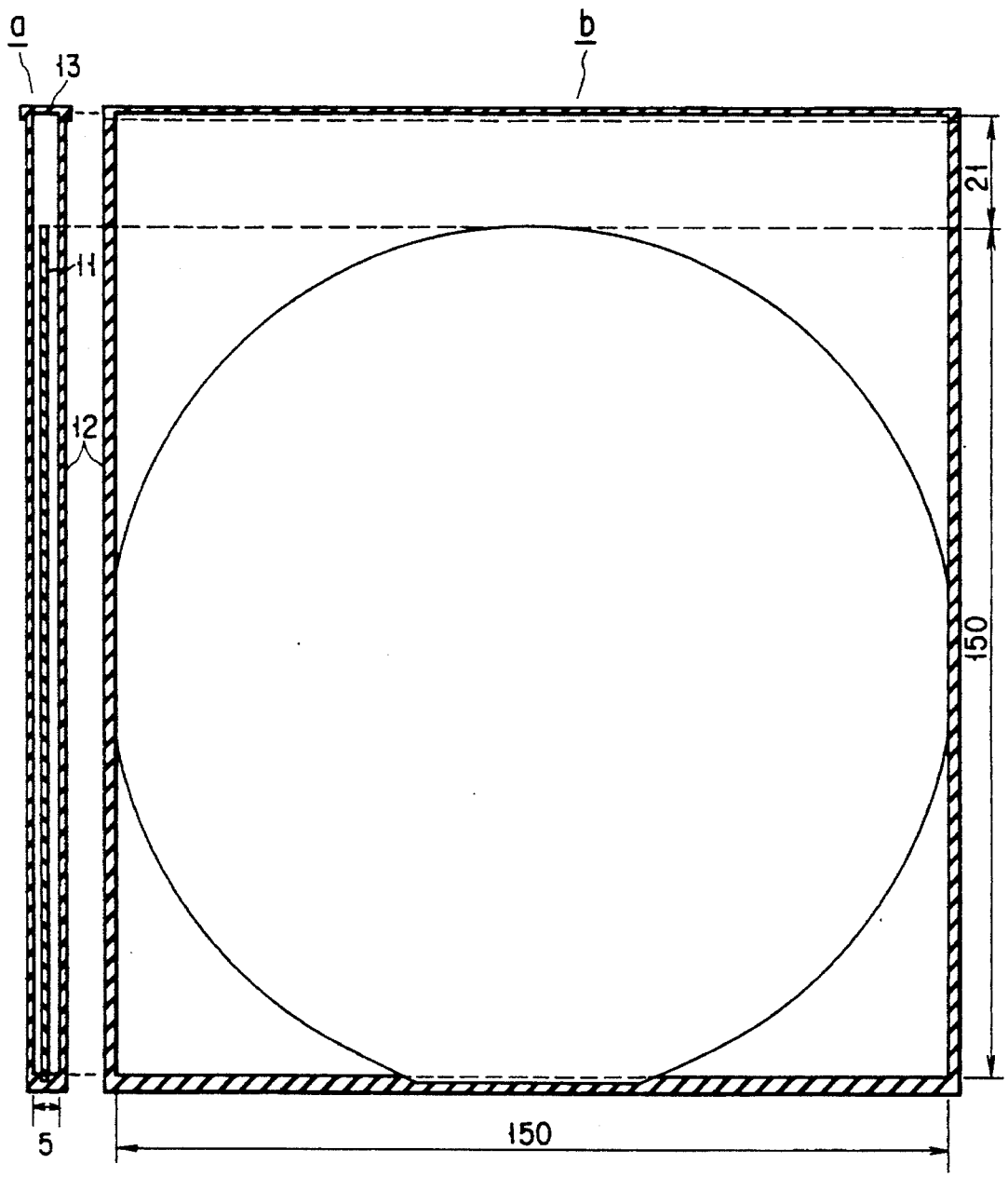
FIG. 1B shows the size of the film-forming part shown in FIG. 1A.

FIG. 1A shows a cross section of the film-forming part of an apparatus for forming a silicon oxide film according to one embodiment of the present invention.

As shown in the drawing, a number of tools 12 each housing a substrate 11 such as a silicon wafer are vertically arranged in the horizontal direction within a constant temperature vessel 14. The end portions of the substrate 11 are fixed within the tool 12 so as to permit the substrate 11 to be kept upright within the tool 12. The clearance between the substrate 11 and the tool 12 is filled with a film-forming solution 16, i.e., a supersaturated hydrofluoric acid solution of silicon oxide, held at such a low temperature as 25° C. or less, such that the entire region of the substrate 11 is covered with the solution 16. In this embodiment, the preserve temperature of the film-forming solution is set at about 0° C. A lid 13 is mounted to cover the upper opening of the tool 12 so as to prevent evaporation of the film-forming solution 16. These tool, substrate and film-forming solution are heated to desired temperatures within the constant temperature vessel 14. In this embodiment, the constant temperature vessel 14 is wound with a coil 91 which is controlled by a control device 92.

A vibrating mechanism 15 is fixed to the lower surface of a base plate to which the tools 12 are mounted. The tool, substrate, and film-forming solution are kept vibrated together by the vibrating mechanism 15 until a thermal equilibrium is established between the temperature of the film-forming solution and the ambient temperature so as to make the convection generated within the film-forming solution uniform and, thus, to prevent a silicon oxide film formed on the surface of the substrate from becoming nonuniform. In this embodiment, the vibrating mechanism 15 generates an ultrasonic wave of 40 KHz. After a thermal equilibrium has been established within the film-forming solution, the vibrating mechanism need not be operated because convection is not generated within the film-forming solution.

FIG. 1B shows the size of the film-forming part shown in FIG. 1A. Parts a and b of FIG. 1B show cross sections perpendicular to each other of a single tool 12 housing a single wafer 11. It is seen that the tool 12 is 171 mm high, 150 mm long, and 5 mm wide. The wafer 11 housed in the tool 12 has a diameter of 6 inches and a thickness of 0.65 mm. The tool 12 is filled with the solution 16 and the upper opening of the tool 12 is covered with the lid 13 so as to prevent evaporation of the solution 16. In this case, the solution layer formed on each of the front and back surfaces of the wafer has a thickness of 2.175 mm. What should be noted is that the amount of the film-forming solution used for a single wafer is only about ¹⁄₁₄, compared with the conventional precipitation method described previously.

To be more specific, the inner volume of the tool 12 is: 0.5×15×17.1=128 cc. On the other hand, the volume of the wafer is 16 cc. It follows that the volume of the film-forming solution housed in the tool 12 is: 128 cc−16 cc=112 cc.

On the other hand, 50 wafers are housed in the film-forming vessel 1 in the conventional precipitation method described previously. In the conventional method, about 80 liters of the film-forming solution is housed in the apparatus. It follows that the amount of the solution required for each wafer is about 1600 cc, which is about 14 times as much as in the embodiment of the present invention. Because of the requirement for a large amount of the solution, the conventional method also necessitates the temperature control time more than about 10 times as long as that for the present invention. It follows that, in actually forming a silicon oxide film by the conventional method, the solution temperature once set to an appropriate level, e.g., about 30° C., at the beginning of the operation is kept constant in general until the film formation on the last wafer is finished. Since the solution temperature is kept constant, the equilibrium of reaction is not changed. Naturally, the conventional method is irrelevant to the technical idea of the present invention that the temperature is changed so as to bring about precipitation of a large amount of silicon oxide. It follows that the film-forming efficiency is very low in the conventional method.

The embodiment shown in FIG. 1B readily permits temperature change with efficiency more than about 10 times as high as in the conventional method. It follows that the film-forming capacity can be markedly improved. Likewise, the processing time can be markedly shortened.

Figure 18:
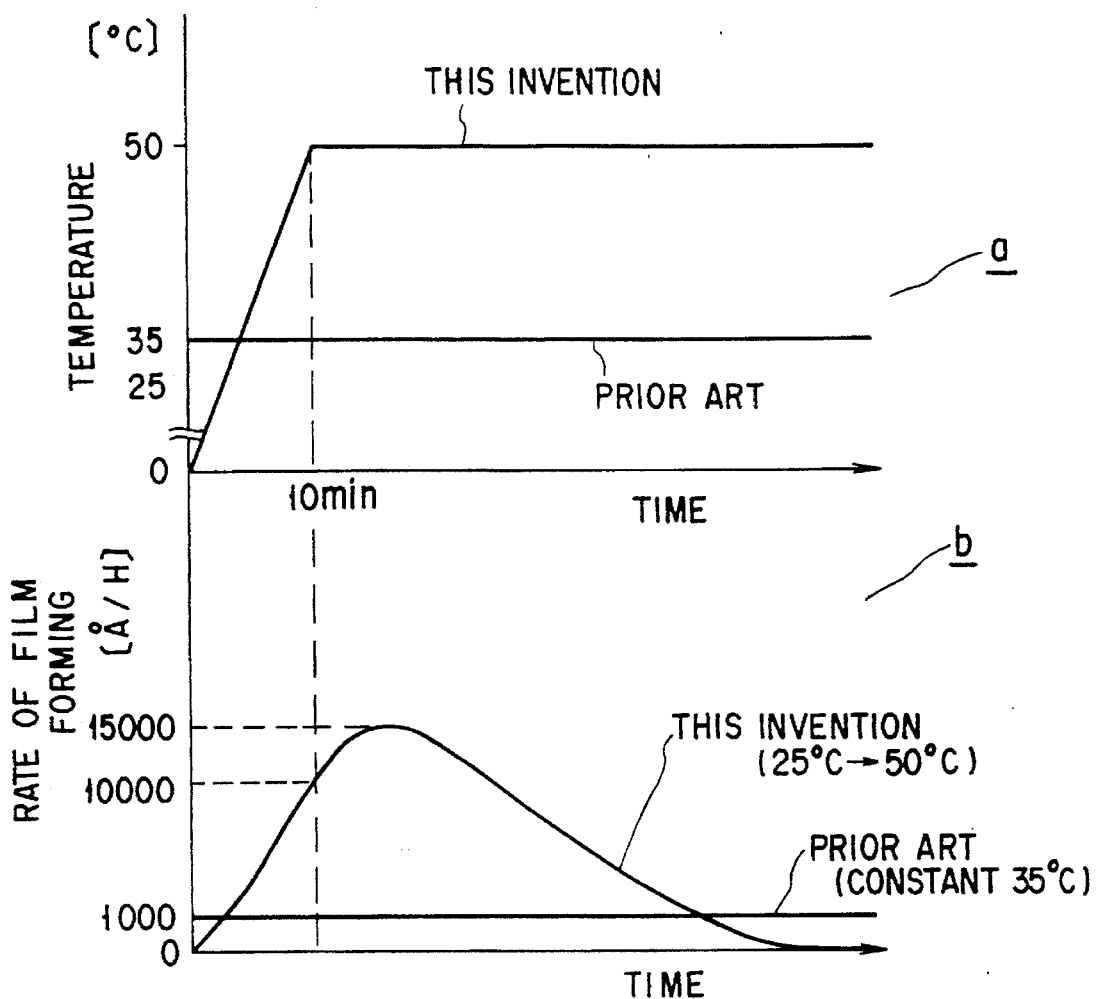
FIG. 18 is a graph showing the relationships between the time and temperature and between the time and film-forming rate in respect of the film-forming apparatus of the present invention.
Figure 19:
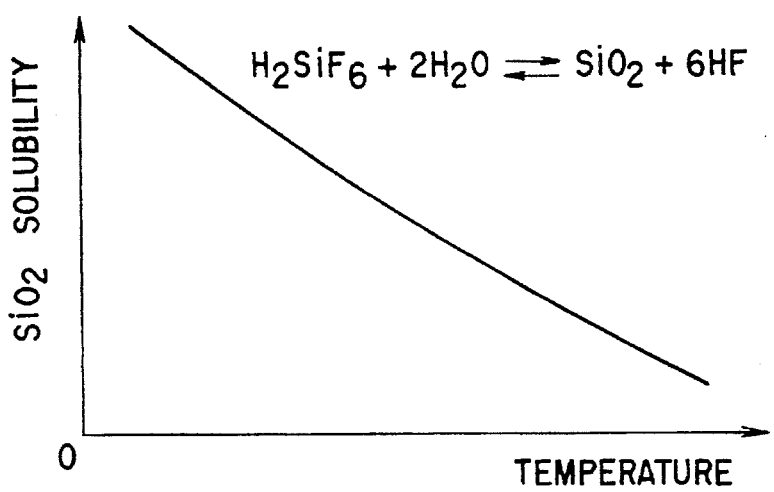
FIG. 19 is a graph showing the relationship between the silicon oxide ($SiO_2$) solubility and temperature in respect of the film-forming apparatus of the present invention.

FIGS. 18 and 19 clearly show the effect of the present invention. Specifically, FIG. 18 includes graphs a and b respectively showing the relationships between the time and temperature and between the time and film-forming rate in respect of the film-forming apparatus of the present invention. On the other hand, FIG. 19 is a graph showing the relationship between the silicon oxide ($SiO_2$) solubility and temperature in respect of the film-forming apparatus of the present invention.

As shown in FIG. 19, the solubility of silicon oxide in hydrofluoric acid depends on temperature. Specifically, the silicon oxide solubility is lowered with temperature elevation. In the present invention, the film-forming solution, which is set initially at a low temperature, e.g., 25° C., is heated to exceed the point of equilibrium denoted by the curve shown in FIG. 19, with the result that the silicon oxide dissolved in the solution is precipitated to form a silicon oxide film on the surface of the wafer. What should be noted is that the film-forming rate can be markedly increased by elevating the solution temperature, as apparent from the graph of FIG. 19.

Graph a included in FIG. 18 shows that the film-forming part included in the apparatus of the present invention is rapidly heated to a desired temperature in a short time. On the other hand, graph b of FIG. 18 shows that the film-forming rate achieved in the present invention is markedly higher than that in the prior art. As described previously, the temperature of the film-forming solution, which is used in a very small amount, can be easily controlled in the present invention, making it possible to achieve a film-forming rate, i.e., 5000 to 15000 Å/H, which is at least 5 times as high as in the prior art, by utilizing the change with temperature in the equilibrium of the film-forming solution.

FIG. 2 shows the control section of the film-forming apparatus of the present invention. It is seen that the control section comprises a storage vessel 17 of a low temperature. The film-forming solution 16, which is saturated with silicon oxide such that the state of supersaturation can be formed immediately after heating of the solution, is stored in the storage vessel 17. During the storage in the storage vessel 17, the solution 16 is kept at a low temperature of not higher than 25° C. so as to prevent silicon oxide from being precipitated from the solution 16.

The film-forming solution 16 stored in the storage vessel 17 is supplied to a film-forming section through a liquid pipe 29. A filter 21 is connected between the storage vessel 17 and the liquid pipe 29 so as to remove the silicon oxide particles generated in only a very small amount within the storage vessel 17. In order to keep the solution 16 sufficiently clean, it is possible to connect, if necessary, a pump 19 and a filter 20 to a pipe 18 extending from a part of the vessel 17 to another part of the vessel 17. In this case, the solution 16 circulated through the pipe 18 is filtered by the filter 20.

The film-forming solution 16 stored in the storage vessel 17 can be prepared in another device (not shown). In this embodiment, however, a control vessel 22 housing a temperature controller 26 and aluminum plates 27 is connected to the storage vessel 17. It is desirable to connect a pump 24 and a filter 25 to a pipe 23 extending from a part of the control vessel 22 to another part of the vessel 22 so as to remove large particles of the precipitated silicon oxide from the solution circulated through the pipe 23. The film-forming solution 16 prepared in the vessel 22 is supplied through a pipe 28 into the storage vessel 17.

In this embodiment, 0.1 to 0.2 mol/liter of aluminum is added to the film-forming solution. In this case, the solution contains about 37 to 39% by weight of $H_2SiF_6$. In the film-forming apparatus of the present invention, the content of $H_2SiF_6$ is lowered to about 25% by weight during circulation of the film-forming solution. However, the film-forming characteristics of the solution are not appreciably changed.

FIG. 3 shows the relationship between the number of particles having a diameter of at least 1 μm and the preserve temperature $T_L$, said particles being precipitated during storage at $T_L$. On the other hand, FIG. 4 shows the relationship between the film-forming rate and the equilibrium temperature $T_H$ in the case where the film-forming solution and the substrate are heated to reach $T_H$. As seen from FIG. 3, the number of particles having a diameter of at least 1 μ, which are contained in the film-forming solution, is increased to exceed $100/cm^3$, if $T_L$ is increased to exceed 25° C. This indicates that, in order to prevent silicon oxide from being precipitated from the film-forming solution 16 within the storage vessel 17, it is necessary to keep the preserve temperature at 25° C. or lower. For achieving the film formation effectively and rapidly, it is desirable to store the film-forming solution 16 at a temperature as low as possible.

FIG. 4 shows that the film-forming rate is increased with increase in the equilibrium temperature $T_H$. Thus, it is desirable to set the temperature of the constant temperature vessel 14 shown in FIG. 1A at a high level, though the temperature should not be exceed 70° C. at which the film-forming solution 16 tends to be decomposed into $SiF_4$ and HF and, thus, to be evaporated. If the film-forming solution 16 is decomposed End evaporated during the heating step, the film-forming solution becomes insufficient or bubbles are formed within the solution so as to impair the silicon oxide film formation, making it necessary to avoid the heating of the solution to temperatures higher than 70° C. Also, large silicon oxide particles tend to be precipitated within the film-forming solution under a high solution temperature. Since the large particles thus precipitated are attached to the substrate as dust, it seems appropriate to set the equilibrium temperature of the film-forming solution 16 at 50° to 60° C. during the film-forming operation. In this case, the film-forming rate reaches as high as 14000 Å/H, which is markedly higher than in the prior art. Since the initial temperature of the solution is set at about 0° C., it is reasonable to understand that the film-forming rate is increased with increase in the difference between $T_L$ and $T_H$.

FIG. 5 shows the relationship between the thickness of the solution layer and the number of particles having a diameter of at least 1 μm, said particles being attached to the wafer in the case where a silicon oxide film having a thickness of 5000 Å was formed by the method of the present invention on a silicon wafer having a diameter of 5 inches. It should be noted that, in order to form a silicon oxide film having a thickness of 1 μm on a substrate, it suffices for the solution layer to have a thickness of about 1 mm, though the value of the thickness differs depending on the method of preparing the film-forming solution. On the other hand, more than 20 silicon oxide particles having a diameter of at least 1 μm are attached to the substrate wafer, if the thickness of the solution layer covering the substrate exceeds 20 mm, as shown in FIG. 5. In this case, the properties of the silicon oxide film formed on the substrate are deteriorated. It follows that it is appropriate to set the thickness of the solution layer at about 20 mm or less.

In the present invention, the film-forming solution 16 is heated for forming a silicon oxide film on the substrate. The solution is rapidly heated in the present invention from a low temperature to a high temperature to make the degree of supersaturation of the film-forming solution markedly higher than that in the prior art, leading to a high film-forming rate. Further, the high degree of supersaturation achieved in the present invention permits improving the utilization rate of the raw material silicon oxide. What should also be noted is that the tool 12 can be washed every time the film-forming operation is finished. Since the tool 12 can be kept clean, dust generation from the tool 12 can also be prevented in the present invention. Further, it is certainly possible to circulate the film-forming solution 16 for filtration. However, the solution is cooled during the circulation, making it difficult to achieve the heating of the solution as desired. In addition, the circulation is not so advantageous in terms of the utilization rate of the solution.

FIG. 6 shows how the silicon oxide film formation is affected by the aluminum addition to the film-forming solution. In this case, the film-forming solution contained about 37 to 38% by weight of $H_2SiF_6$. The aluminum concentration was 0.2 mol/liter for curve A, 0.2 mol/liter for curve B, 0.1 mol/liter for curve C, and 0.18 mol/liter for the prior art. The relationship between the equilibrium temperature $T_H$ and the thickness of the silicon oxide film formed was measured in this experiment, with the preserve temperature $T_L$ of the film-forming solution set at 0° C. The substrate silicon wafer was vertically arranged within the film-forming solution for the silicon oxide film formation. The film-forming time was found to be 1.5 hours for curve A, 0.5 hour for curve B, 0.5 hour for curve C, and 1 hour and 0.5 hour for the prior art. As shown in FIG. 6, the film-forming rate for the present invention, in which a large difference is provided between the preserve temperature $T_L$ and the equilibrium temperature $T_H$, was markedly higher than for the prior art. Also, the thickness of the formed film is increased with increase in the aluminum concentration.

FIG. 7 shows the relationship between the preserve temperature $T_L$ and the film-forming rate, with the equilibrium temperature set constant. In the experiments relating to FIGS. 3 to 6, the substrate was vertically arranged within the film-forming solution. In the experiment relating to FIG. 7, however, the substrate was horizontally disposed within the film-forming solution for forming a silicon oxide film. The film-forming solution used contained 37 to 38% by weight of $H_2SiF_6$ and 0.1 mol/liter of aluminum. The solution was used 10 days after preparation. The equilibrium temperature $T_H$ was set at 50° C. in every case, and the thickness of the silicon oxide film was measured 30 minutes later. As shown in the graph, the thickness of the silicon oxide film was found to be 6500 Å, 5700 Å and 3000 Å where the preserve temperature was set at 0° C., 5° C. and 25° C., respectively. It follows that the film-forming rate is increased with increase in the difference between the preserve temperature and the equilibrium temperature, as pointed out previously. In other words, the film-forming rate is greatly dependent on the degree of supersaturation of the film-forming solution.

Figure 8:
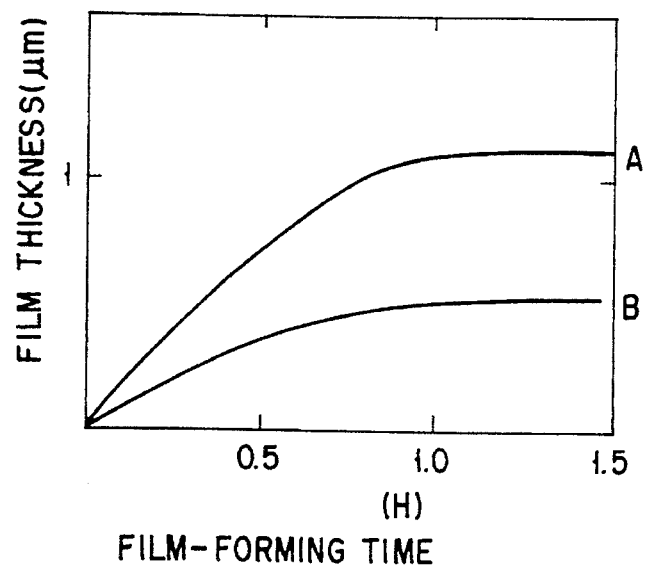
FIG. 8 is a graph showing the relationship between the thickness of the formed film and the film-forming time.
Figure 9A:
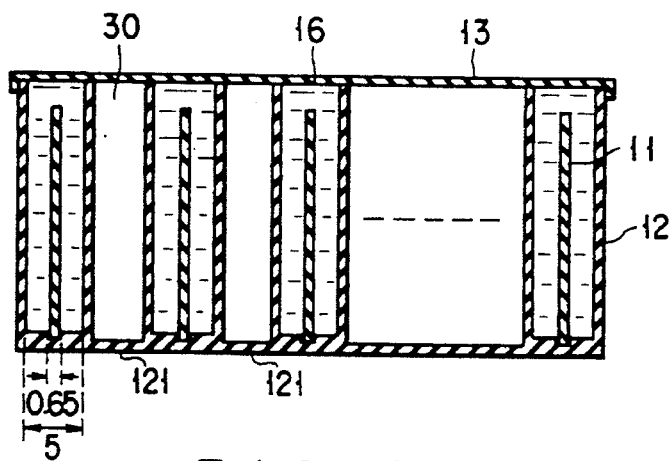
Figure 9B:
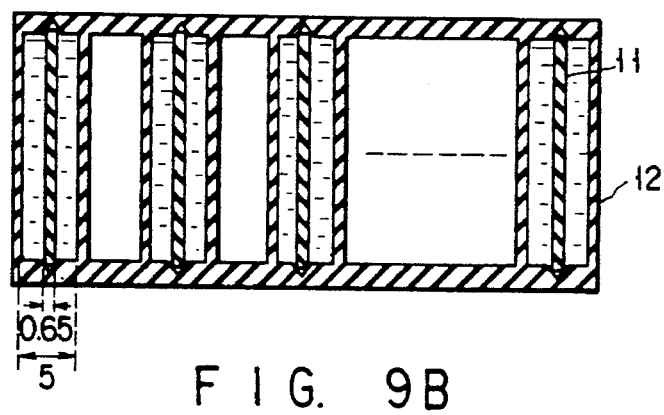

FIG. 8 shows the relationship between the film-forming time and the thickness of the formed film. In this experiment, the substrate was vertically arranged within the film-forming solution. Film-forming solutions A and B contained about 38% and 20% by weight of $H_2SiF_6$, respectively, and 0.2 mol/liter of aluminum was added to each of solutions A and B. As shown in FIG. 8, the film thickness was increased until the film-forming time reached about 1 hour in each of cases A and B. However, no further increase in the film thickness was recognized after the film-forming time exceeded about 1 hour. FIG. 8 also shows that the thickness of the silicon oxide film is dependent on the concentration of $H_2SiF_6$. In other words, the thickness of the silicon oxide film can be controlled by controlling the $H_2SiF_6$ concentration of the film-forming solution. In the present invention, it is desirable to set the concentration of $H_2SiF_6$ to fall within a range of between 20% and 38% by weight.

A constant temperature vessel is used as a heating means in the embodiment shown in FIG. 1A. Alternatively, it is possible to use a water bath or a heater as a heating means. Also, a large number of tools 12 each housing a substrate 11 and standing upright are arranged in the horizontal direction in the embodiment of FIG. 1A. However, these tools 12 may be arranged to lie such that the substrate 11 housed therein extends in the horizontal direction. Further, a plurality of substrates may be housed in each tool 12. Still further, the substrates may be arranged by utilizing the surface tension of the film-forming solution without using the tool 12.

FIGS. 9 to 13 show other embodiments of the present invention with respect to the construction of the tool 12 and the substrate arrangement. Specifically, FIGS. 9A and 9B are a cross sectional view and a plan view, respectively, showing the tool 12 and substrates housed therein. As shown in these drawings, the tool 12 comprises a plurality of tool sections each housing a substrate 11. The end portion of the substrate 11 is fixed within the tool section so as to keep the substrate 11 upright within the tool section. For fixing the substrate a groove is formed on the inner side wall and bottom wall of the tool 12. The end portion of the substrate 11 is engaged with the groove for fixing the substrate. Further, the tool sections are joined to each other by a joining portion 121 so as to form an integral structure constituting the tool 12. A clearance 30 formed between adjacent tool sections is filled with water or air, making it possible to effectively heat the tool sections. Further, each tool section is filled with a film-forming solution 16 in a manner to cover the entire region of the substrate 11. Still further, a lid 13 is disposed to close the entire upper opening of the tool 12 so as to prevent substantially completely the evaporation of the film-forming solution 16. It should be noted that the clearance 30 noted above makes it possible to heat uniformly the both surfaces of the substrate 11. In this embodiment, the tool section is 5 mm wide, and the substrate wafer is 0.65 mm thick. It follows that the solution layer 11 covering each surface of the substrate 11 is 2.175 mm thick. Of course, the thickness of the solution layer 11 need not be restricted to 2.175 mm as far as the solution layer is thin enough to produce the particular effect of the present invention.

FIGS. 10A and 10B are a cross sectional view and a plan view, respectively, showing the tool 12 and substrates housed therein according to another embodiment of the present invention. In this embodiment, a number of substrates are vertically arranged within the tool 12. Evaporation of the film-forming solution 16 is suppressed by a lid 13 covering the entire upper end of the tool 12. In this embodiment, a large amount of the film-forming solution is housed in the tool 12, with the result that a longer heating time is required for elevating the temperature of the solution to a desired level. However, the construction of the tool 12 is very simple, making it possible to handle the substrates very easily within the tool 12. Also, a number of substrates can be simultaneously processed easily in this embodiment.

In the embodiment of FIG. 10, each substrate 11 is held upright. However, the substrate 11 may be inclined by about 45°. If the substrate 11 is inclined by about 3° from the vertical, the inclination permits facilitating the release of the bubbles formed within the film-forming solution during the film formation from the substrate surface. It follows that the film can be formed uniformly. The particular effect produced by the inclination can also be produced in the case where a single substrate is housed in the tool 12. Further, release of the bubbles can be facilitated in the case of horizontally disposing the substrate, if the substrate is somewhat inclined. It should be noted that the distance between adjacent substrate wafers 11 disposed within the tool 12 is 4.76 mm. Of course, the distance need not be restricted to 4.76 mm as far as the amount of the film-forming solution positioned between the adjacent substrates is small enough to ensure the particular effect of the present invention.

FIG. 11 is a plan view showing the tool 12 and substrates 11 housed therein according to another embodiment of the present invention. The embodiment of FIG. 11 is intermediate in technical idea between the embodiments of FIGS. 9 and 10. In the embodiment of FIG. 11, a number of substrates 11 are vertically fixed at once within the tool 12. These substrates are engaged with grooves formed on the bottom of the tool 12 so as to make the substrates stationary within the tool 12. As seen from the drawing, a groove is not formed on the inner surface of the wall of the tool 12. Since a clearance is provided between the inner wall of the tool and the substrate 11, the circulation of the film-forming solution is facilitated within the tool 12. As a result, the film-forming solution 16 can be poured at once into the tool 12. Further, a clearance 30 is provided between adjacent substrates 11, making it possible to heat the film-forming solution 16 to the equilibrium temperature in a short time, as in the embodiment of FIG. 10. Incidentally, it is not absolutely necessary to provide the clearance 30 for every substrate. In other words, it is possible to interpose a plurality of substrates 11 between adjacent clearances 30. In this case, the optimum distance between the adjacent substrates separated from each other by the solution alone is 0.1 to 8.0 mm. This is also the case with the embodiment of FIG. 10. Where the distance between the adjacent substrates noted above falls within the range noted above, it is possible to suppress attachment of large particles having a diameter of at least 1 μm to a silicon wafer having a diameter of 5 inches. Specifically, only two or three large particles are attached to the wafer. It follows that it is possible to form a silicon oxide film of good characteristics. In addition, the productivity can be increased because a larger number of substrates can be mounted in the tool 12. Further, the heating of the solution is facilitated.

In the embodiments of FIGS. 9 to 11, the lower end of the substrate is in contact with the bottom of the tool 12. However, it is possible to fix the substrate in the intermediate portion of the tool such that the lower end of the substrate is not in contact with the bottom of the tool.

FIG. 11 shows that the solution layer has a thickness of 4.76 mm. It is also shown that the substrate 11 is 0.65 mm thick and that the clearance 30 is 5 mm wide in the inner surface and 7 mm wide in the outer surface. However, the size shown in FIG. 11 is no more than an example. Of course, the size can be determined appropriately as far as the amount of the film-forming solution is small enough to produce the particular effect of the present invention.

Figure 12A:
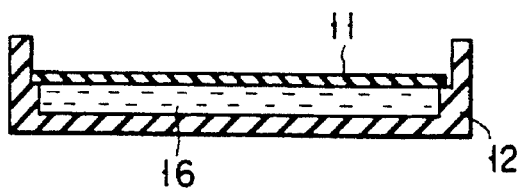
Figure 12B:
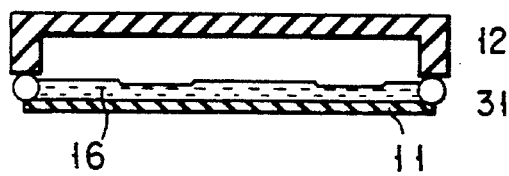
Figure 12C:
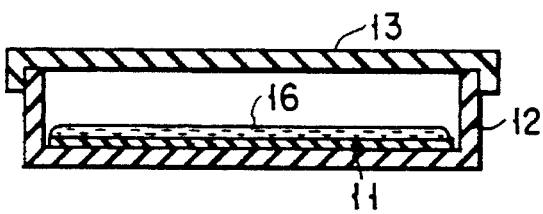

FIGS. 12A, 12B and 12C are cross sectional views each showing an additional embodiment of the present invention. In the embodiment of FIG. 12A, the substrate 11 is disposed to lie horizontal within the tool 12, and the clearance between the substrate 11 and the bottom surface of the tool 12 is completely filled with the film-forming solution. As apparent from the drawing, a silicon oxide film is formed on the lower surface alone of the substrate 11. Of course, it is possible to use a system consisting of a plurality of structures shown in FIG. 12A, if desired.

In the embodiment of FIG. 12B, the substrate 11 is also disposed to lie horizontal. In this case, the upper surface alone of the substrate 11 is covered with the film-forming solution 16. Naturally, a silicon oxide film is formed on the upper surface alone of the substrate 11. Of course, it is possible to use a system consisting of a plurality of structures shown in FIG. 12B, if desired. In this embodiment, the bubbles, even if generated within the film-forming solution 16, are released upward and, thus, are not attached to the substrate.

The substrate 11 is also disposed to lie horizontal in the embodiment of FIG. 12C, too. In this embodiment, the film-forming solution is held by its own surface tension on the upper surface of the substrate 11. It is possible to dispose the substrate 11 on the bottom surface of the tool 12, as shown in the drawing. Further, the upper opening of the tool 12 is covered with a lid 13. In this embodiment, the film-forming solution is not in direct contact with the tool, making it possible to prevent substantially completely the dust generation caused by the deposition and peeling of silicon oxide. This embodiment is useful when it is desired to form a silicon oxide film on a part of the substrate surface.

Figure 13:
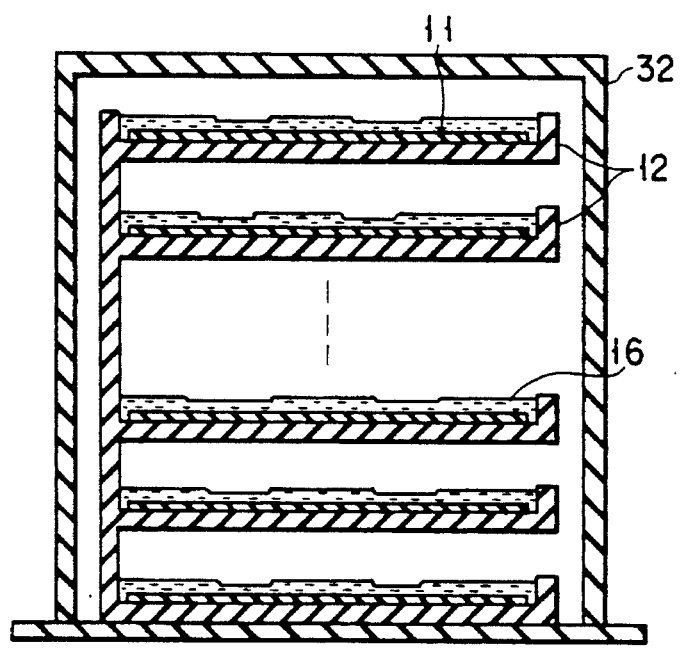

FIG. 13 shows a still another embodiment of the present invention. In this case, a plurality of tools 12 are stacked one upon the other, and these tools 12 are joined to each other at one end so as to form an integral structure. A substrate 11 is disposed to lie horizontal within each tool 12, and the upper surface of the substrate 11 is covered with the film-forming solution 16. Further, the integral structure consisting of the plural tools 12 is housed in a vessel 32 so as to suppress evaporation of the solution 16 in the heating step. Of course, a plurality of substrates can be processed simultaneously in this embodiment. If the amount of the solution 16 positioned on the upper surface of the substrate 11 is small enough to permit the solution 16 to be held by its own surface tension, it is possible to markedly suppress the dust generation caused by deposition and peeling of silicon oxide, as in the embodiment of FIG. 12C.

The silicon oxide film formed by the method of the present invention, i.e., SORD film, exhibits excellent electrical characteristics. In addition, the step coverage of the oxide film to a semiconductor substrate is more excellent than that of other insulating films. It follows that the silicon oxide film formed by the method of the present invention is useful particularly where the oxide film is used as an interlayer insulation film in a semiconductor device, as shown in FIG. 14. It should be noted in this connection that the reaction within the film-forming solution between aluminum and hydrofluoric acid is utilized for precipitating silicon oxide in the method of the present invention, as described previously. Thus, an aluminum wiring included in the semiconductor device should not be brought into direct contact with the film-forming solution. It follows that where an aluminum wiring is included in the substrate surface, it is necessary to form a thin plasma CVD $SiO_2$ film using TEOS as a raw material before formation of the SORD film.

FIG. 14 is a cross sectional view showing a semiconductor substrate 61 including active regions. The surface of the substrate 61 is covered with a CVD $SiO_2$ film, a BPSG film, or a laminated film 65 thereof. An aluminum wiring 66 is formed on the laminated film 65, and a plasma CVD $SiO_2$ film 67 is formed to cover the aluminum wiring 66. Further, a SORD film 68 is formed by the method of the present invention in a thickness of about 1 μm so as to form an interlayer insulation film.

FIG. 15 shows that the method of the present invention can be employed in the manufacture of a photo mask used in an exposure apparatus. Where a photo mask is prepared by forming a mask pattern 72 including of, for example, Cr on a glass substrate 71, as shown in the drawing, the phase of the incident light is deviated in some cases at the edge portion of the mask pattern, resulting in failure to form an accurate resist pattern. In this case, it is desirable to form an SORD film 73 by the method of the present invention in a thickness of about 2000 Å so as to cover the edge portion of the mask pattern 72. The SORD film 73 thus formed permits correctly shifting the phase of the incident light.

Figure 16:
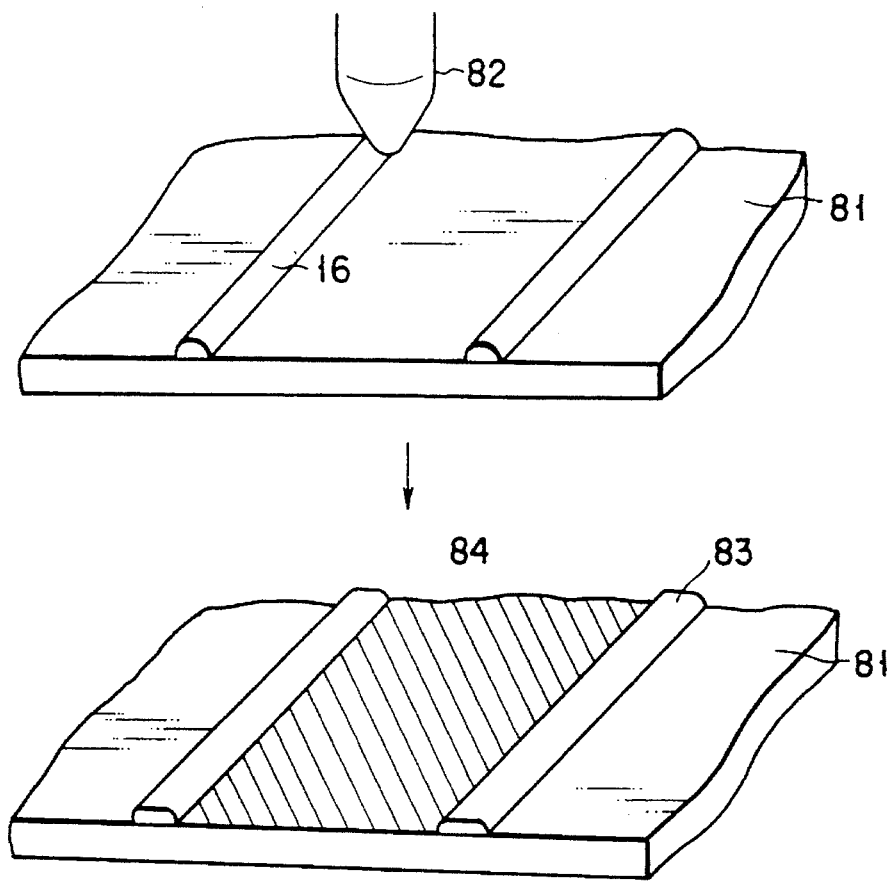
FIG. 16 is an oblique view showing a wiring substrate prepared by employing the technical idea of the present invention.
Figure 17:
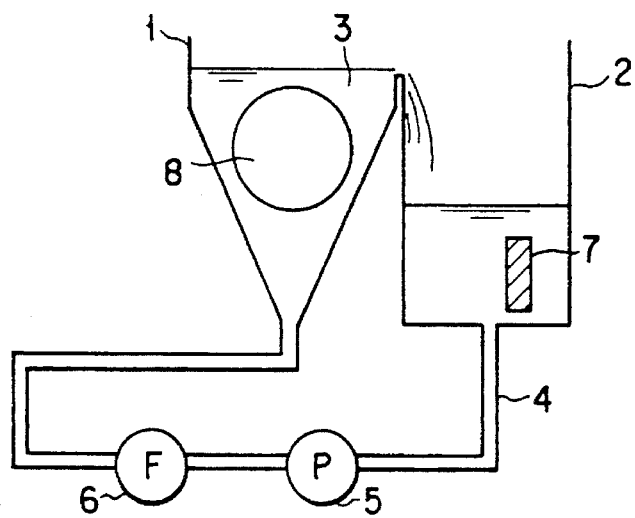
FIG. 17 is a cross sectional view showing a conventional apparatus for forming a silicon oxide film.

FIG. 16 shows that the method of the present invention can be employed in the manufacture of a printed circuit board. In forming a printed circuit board on which a semiconductor chip such as an LSI is mounted, it is popular nowadays to employ a method utilizing a metal paste. However, it is considerably difficult to coat the substrate surface with a metal paste uniformly and in parallel with the substrate surface. If a metal paste is used for forming a fine wiring pattern, short-circuiting is likely to take place between adjacent wiring layers. To overcome the difficulty, a desired portion on the surface of a wiring substrate 81 is coated with a the film-forming solution 16 taken out through a nozzle 82. As a result, silicon oxide grows to form a silicon oxide film 83 which projects from the surface of the substrate 81. Then, that region of the substrate surface which is defined by the projecting silicon oxide film 83 is coated with a metal paste so as to form a wiring 84. In this case, the adjacent wirings are separated from each other by the silicon oxide film 83. It follows that a short-circuiting need not be worried about.

As described previously, a vibrating mechanism 15 is included in the film-forming apparatus shown in FIG. 1A. The vibrating mechanism 15 is vibrated in the vertical direction. The substrate 11, which is fixed upright, is vibrated by the vibrating mechanism in a direction perpendicular to the thickness direction of the substrate. If the vibrating mechanism is vibrated with a frequency of 50 Hz to 40 kHz, a silicon oxide film is formed uniformly on the substrate surfaces. When vibration was imparted to the substrate in the thickness direction, the silicon oxide film formation was made unsatisfactory in the high frequency of the vibration.

It is necessary to select the material of the tool 12 in view of the deposition of the silicon oxide precipitated from the film-forming solution. Specifically, it is desirable for the silicon oxide once attached to the tool 12 not to be peeled off easily. In this sense, the tool 12 should be formed of SiC or quartz. It is also desirable that the silicon oxide be scarcely attached to the tool 12. In this sense, it is desirable to use the material of Cr for forming the tool 12. When it comes to the tool 12 made of Teflon or polyvinyl chloride, however, silicon oxide attached to the tool 12 is readily peeled off so as to be deposited on the substrate in the form of silicon oxide particles. Naturally, Teflon, polyvinyl chloride or the like should not be used for forming the tool 12.

The silicon oxide film-forming apparatus of the present invention may further comprise a washing-drying mechanism for facilitating the pre-treatment or after-treatment of the substrate or for facilitating the washing of the tool. It is also possible to incorporate an automatic transfer system into the apparatus of the present invention so as to save the man power required for the transfer of the substrate, tool, etc.

Where the equilibrium temperature of the film-forming solution is set at 50° C., the apparatus of the present invention permits a film-forming rate which is about 5 to 15 times as high as that achieved by the conventional apparatus. Specifically, the film-forming rate achieved by the conventional apparatus is about 1000 Å/H at a film-forming temperature of about 35° C. On the other hand, the apparatus of the present invention permits achieving a film-forming rate as high as 5000 to 15000 Å/H.

In the case of using the tool 12 constructed as shown in FIG. 9, about 40% of silicon oxide dissolved in the film-forming solution can be deposited on the substrate. On the other hand, the utilization rate of the raw material silicon oxide is only about 1% in the conventional apparatus. When a silicon oxide film formed on the substrate was observed with an electron microscope, recognized were dome-like silicon oxide projections having a diameter smaller than 0.5 $\mu$m, i.e., silicon oxide particles precipitated from the film-forming solution and attached to the substrate. However, the dust generated from the film-forming apparatus was not recognized at all. In conclusion, the film-forming apparatus of the present invention permits improving the film-forming rate and the utilization rate of the raw material silicon oxide. In addition, the dust generation from the apparatus can be suppressed.

As described above in detail, the particular construction of the present invention permits markedly improving the forming rate of a silicon oxide film. In addition, the dust generation from the film-forming apparatus can be effectively suppressed, making it possible to form a silicon oxide film having excellent characteristics. Further, the amount of silicon oxide attached to, for example, the inner surface of the vessel of the film-forming solution is markedly smaller in the present invention than in the prior art. It follows that the present invention permits markedly improving the utilization rate of the raw material silicon oxide.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An apparatus for forming a silicon oxide film on a silicon wafer, comprising:

means for keeping a supersaturated hydrofluoric acid solution of silicon oxide in a thickness not more than 20 mm; and means for heating the supersaturated solution until the solution reaches a thermal equilibrium.

2. An apparatus according to claim 1, further comprising means for controlling the temperature of the supersaturated solution at about 25° C. or lower.

3. An apparatus according to claim 1, wherein said heating means heats the supersaturated solution to about 20° C.

4. An apparatus according to claim 1, wherein the thermal equilibrium temperature is 25° to 70° C.

5. An apparatus according to claim 1, wherein the thermal equilibrium temperature is 50° to 60° C.

6. An apparatus according to claim 1, wherein the wafer is held upright within the means for keeping the supersaturated solution on the silicon wafer.

7. An apparatus according to claim 1, wherein a plurality of the means for keeping the supersaturated solution on the silicon wafer are stacked one upon the other at an interval, each means having a single wafer housed therein and the supersaturated solution being kept on the wafer by the surface tension.

8. An apparatus according to claim 1, wherein the wafer is inclined from the horizontal within the means for keeping the supersaturated solution on the silicon wafer.

9. An apparatus according to claim 1, wherein a plurality of silicon wafers are housed in the means for keeping the supersaturated solution on the silicon wafer.

10. An apparatus according to claim 9, wherein the wafers are disposed 0.1 to 8.0 mm apart from each other.

11. An apparatus according to claim 1, wherein a plurality of means for keeping the supersaturated solution on the silicon wafer are disposed apart from each other with a clearance provided therebetween, each means housing a single wafer.

12. An apparatus according to claim 1, further comprising means for vibrating the means for keeping the supersaturated solution on the silicon wafer.

13. An apparatus according to claim 1, wherein the means for keeping the supersaturated solution on the silicon wafer is constructed such that the solution layer is formed in contact with the upper surface of the silicon wafer.

14. An apparatus according to claim 1, wherein the means for keeping the supersaturated solution on the silicon wafer is constructed such that the solution layer is formed in contact with the lower surface of the silicon wafer.

15. An apparatus according to claim 1, wherein the supersaturated solution contains aluminum or boric acid.

16. An apparatus according to claim 1, wherein the solution layer is kept on the silicon wafer by utilizing the surface tension of the solution.

17. An apparatus according to claim 1, wherein a groove for holding the silicon wafer is formed in the means for keeping the supersaturated solution on the silicon wafer.

18. An apparatus according to claim 1, wherein the means for keeping the supersaturated solution on the silicon wafer contains SiC, quartz or the material of Cr.

19. An apparatus for forming a silicon oxide film on a silicon wafer, comprising:

means for controlling the temperature of a supersaturated hydrofluoric acid solution of silicon oxide at about 25° C. or lower;

means for keeping said supersaturated solution on a silicon wafer in a thickness not more than 20 mm; and means for heating the supersaturated solution to 25° to 70° C.

20. An apparatus for forming a silicon oxide film on a silicon wafer, comprising:

means for keeping a reacting solution of a temperature on the surface of a silicon wafer in a thickness not more than 20 mm; and means for heating the reacting solution until the solution reaches a thermal equilibrium.

* * * * *